US011211385B2

(12) United States Patent
Chang

(10) Patent No.: US 11,211,385 B2
(45) Date of Patent: Dec. 28, 2021

(54) SEMICONDUCTOR DEVICE AND MANUFACTURING METHOD THEREOF

(71) Applicant: NANYA TECHNOLOGY CORPORATION, New Taipei (TW)

(72) Inventor: Chia-Lin Chang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/799,860

(22) Filed: Feb. 25, 2020

(65) Prior Publication Data

US 2021/0265354 A1 Aug. 26, 2021

(51) Int. Cl.
*H01L 27/108* (2006.01)
*H01L 49/02* (2006.01)
*H01L 21/311* (2006.01)
*H01L 29/78* (2006.01)
*H01L 23/528* (2006.01)

(52) U.S. Cl.
CPC .. *H01L 27/10808* (2013.01); *H01L 21/31111* (2013.01); *H01L 23/5283* (2013.01); *H01L 27/10855* (2013.01); *H01L 28/90* (2013.01); *H01L 29/7827* (2013.01)

(58) Field of Classification Search
CPC .......... H01L 27/10808; H01L 23/5283; H01L 28/90; H01L 21/31111; H01L 27/10855; H01L 29/7827; H01L 27/108–10826; H01L 27/10844–10858; H01L 27/10873–10897; H01L 27/1023; H01L 2924/1436–14369
See application file for complete search history.

(56) References Cited

U.S. PATENT DOCUMENTS

| 7,049,203 | B2* | 5/2006 | Chung | H01L 27/10855 257/303 |
| 7,511,328 | B2* | 3/2009 | Seo | H01L 21/76895 257/311 |
| 7,582,925 | B2* | 9/2009 | Jung | H01L 27/0207 257/296 |
| 2004/0075156 | A1* | 4/2004 | Lee | H01L 28/91 257/503 |
| 2014/0015027 | A1* | 1/2014 | Mikasa | H01L 29/7827 257/296 |

FOREIGN PATENT DOCUMENTS

TW I671860 B 9/2019
TW I685086 B 2/2020

* cited by examiner

*Primary Examiner* — Jonathan Han
(74) *Attorney, Agent, or Firm* — CKC & Partners Co., LLC

(57) ABSTRACT

A semiconductor includes a semiconductor substrate and pillar type capacitors. The semiconductor substrate includes first connecting pads and second connecting pads. The second connecting pads are disposed on the first connecting pads respectively, and the pillar type capacitors are disposed on the second connecting pads respectively. A first ends of the pillar type capacitors are connected to the second connecting pads respectively, and a second ends of the pillar type capacitors area at the opposite side of the first ends. The distance between the first end and the second end of each of the pillar type capacitors is from 1 micrometer to 1.8 micrometer. A manufacturing method is also provided.

8 Claims, 8 Drawing Sheets

SEMICONDUCTOR DEVICE AND MANUFACTURING METHOD THEREOF

BACKGROUND

Field of Disclosure

The present disclosure relates to semiconductor device and manufacturing method thereof. More particularly, the present disclosure relates to semiconductor device having pillar type capacitors and the manufacturing method thereof.

Description of Related Art

Electrical products are becoming lighter, thinner, shorter, and smaller, and dynamic random access memories (DRAM) are being scaled down to match the trends of high integration and high density. A DRAM including many memory cells is one of the most popular volatile memory device utilized today. Each memory cells includes a transistor and at least a capacitor, and the transistor and the capacitor form a series connection with each other. The memory cells are arranged into memory arrays. The memory cells are addressed via a word line and a digit line, one of which addresses a column of memory cells while the other addresses a row of memory cells. By using the word line and the digit line, a DRAM cell can be read and programmed.

Recently, there has been increasing research on the buried word line cell array transistor, in which a word line is buried in a semiconductor substrate below the top surface of the substrate using a metal as a gate conductor. However, as the reduction of the transistor size also reduces the distance between cells, and sizes of the capacitors also require reduction.

SUMMARY

The present disclosure relates in general to a semiconductor device and a manufacturing method thereof.

According to an embodiment of the present disclosure, a semiconductor includes a semiconductor substrate and pillar type capacitors. The semiconductor substrate includes first connecting pads and second connecting pads. The second connecting pads are disposed on the first connecting pads respectively, and the pillar type capacitors are disposed on the second connecting pads respectively. A first ends of the pillar type capacitors are connected to the second connecting pads respectively, and a second ends of the pillar type capacitors area at the opposite side of the first ends. The distance between the first end and the second end of each of the pillar type capacitors is from 1 micrometer to 1.8 micrometer.

In an embodiment of the present disclosure, the shape of each of the first connecting pads has square shape, and each of the second connecting pads has round shape.

In an embodiment of the present disclosure, each of the pillar type capacitors is aligned with one of the second connecting pads.

In an embodiment of the present disclosure, each of the pillar type capacitors is misaligned with one of the first connecting pads which electrically connected to the pillar type capacitors.

In an embodiment of the present disclosure, the semiconductor substrate has a connecting surface, and the second connecting pads are located at the connecting surface. The second connecting pads are arranged in a hexagonal lattice manner.

In an embodiment of the present disclosure, each of the first connecting pads has a square shape, and lengths of sides of the square shape are from 30 nanometer to 50 nanometer.

In an embodiment of the present disclosure, each of the second connecting pads has a round shape, and diameter of the round shape is from 20 nanometer to 25 nanometer.

In an embodiment of the present disclosure, the semiconductor substrate includes vertical transistors, and the vertical transistors are connected to the first connecting pads respectively.

According to an embodiment of the present disclosure, a method of manufacturing a semiconductor device includes: providing a semiconductor substrate having a plurality of first connecting pads and a plurality of second connecting pads being disposed on the first connecting pads respectively; forming a plurality of insulating layers on the second connecting pads on the semiconductor substrate; etching the insulating layer and forming a plurality of vertical holes corresponded to the second connecting pads respectively; and forming a pillar type capacitor in each of the vertical holes. The power of the etching is from 900 W to 1100 W.

In an embodiment of the present disclosure, the step of etching the insulating layer further includes: etching the insulating layer with air flow from 1 to 3 standard cubic centimeter per minutes.

In an embodiment of the present disclosure, the step of forming a plurality of insulating layers includes: disposing a first nitride layer; disposing a first insulating filling layer; disposing a second nitride layer; disposing a second insulating filling layer; and disposing a third nitride layer.

In an embodiment of the present disclosure, the first nitride layer has a first thickness, and the second nitride layer has a second thickness, and the third nitride layer has a third thickness, and the third thickness is larger than the first thickness, and the first thickness is larger than the second thickness.

In the aforementioned embodiments of the present disclosure, since the pillar type capacitors have length from 1 micrometer to 1.8 micrometer, the pillar type capacitors can provide proper capacitance in the semiconductor device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
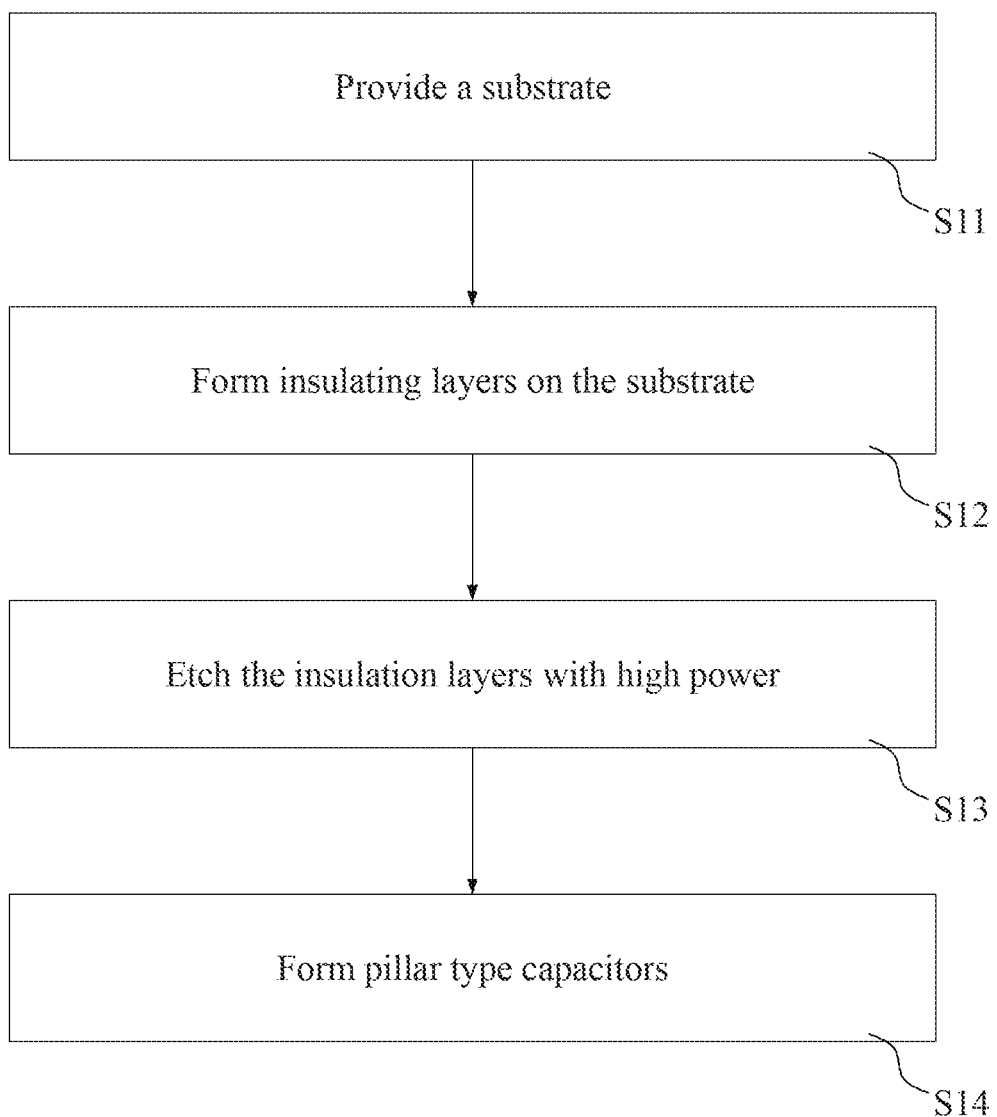
FIG. 1 is a flow chart of a method of manufacturing a semiconductor device of an embodiment of the present disclosure.

The present disclosure relates to an improvement in semiconductor device and the manufacturing method thereof. The following description is presented to enable one of ordinary skill in the art to make and use the disclosure as provided in the context of a particular application and its requirements. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

In the figures, the thickness of layers, films, panels, regions, etc., are exaggerated for clarity. Throughout the specification, the same reference numerals denote the same component. It will be understood that when a component such as a layer, a film, a region or a substrate is referred to as "on" or "connected to" another component, intermediate components can also be present. In contrast, when a component is referred to as "directly on" or "directly connected to" another component, no intermediate component can be present. As used herein, "connected" may refer to both physical and/or electrical connections. Furthermore, "electrical connection" or "coupled" may be the presence of other components between two elements.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Reference will now be made in detail to the present embodiments of the disclosure, examples of which are illustrated in the accompanying drawings. Wherever possible, the same reference numbers are used in the drawings and the description to refer to the same or like parts.

The terms "forming," "form," "deposit," or "dispose" are used herein to describe the act of applying a layer of material to another layer. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a layer. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD).

FIG. 1 is a flow chart of a method of manufacturing a semiconductor device of an embodiment of the present disclosure. Referring to FIG. 1, the method of manufacturing a semiconductor device includes: providing a semiconductor substrate (Step S11); forming a plurality of insulation layers on the semiconductor substrate (Step S12); etching the insulation layers with high power (Step S13); and forming pillar type capacitor (Step S14).

In the embodiment, the semiconductor substrate has a plurality of first connecting pads and a plurality of second connecting pads, and the second connecting pads are disposed on the first connecting pads respectively. The insulating layers are disposed on the second connecting pads of the semiconductor substrate before etching. The power of etching is 1000 W, and the etching process form vertical holes, and positions of the vertical holes are corresponded to positions of the second connecting pads respectively. The pillar type capacitors are disposed in the vertical holes respectively.

In the method of the embodiment, etching the insulating layers with power of 1000 W can form the vertical holes properly, and depth of each of the vertical holes can be more than 1 micrometer. For example, the depth of each of the vertical holes form by the etching process is in the range from 1 micrometer to 1.8 micrometer, and, therefore, the lengths of the pillar type capacitors can be longer, and the pillar type capacitors can provide proper capacitance.

In some embodiment of the present disclosure, the power of etching is in the range from 900 W to 1100 W.

FIGS. 2, 4, 6-8 are sectional views illustrating various fabricating stages of a method for manufacturing the semiconductor device of the embodiment of the present disclosure. FIGS. 3 and 5 are schematic plan view of the semiconductor device according to FIGS. 2 and 4, respectively.

Figure 2:
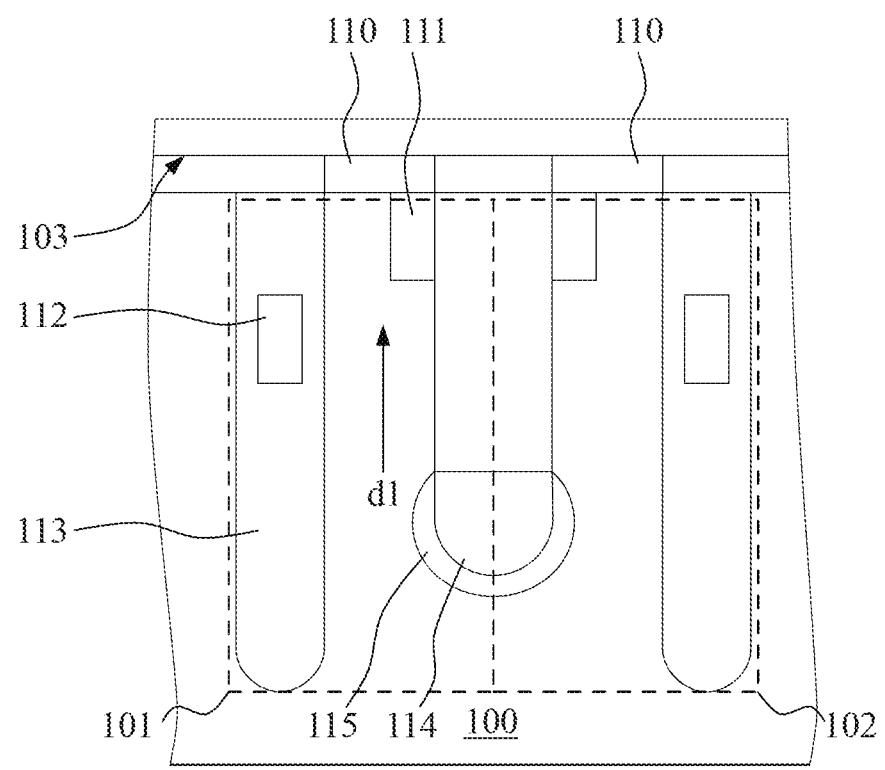
FIGS. 2, 4, 6-8 are sectional views illustrating various fabricating stages of a method for manufacturing the semiconductor device of the embodiment of the present disclosure.
Figure 3:
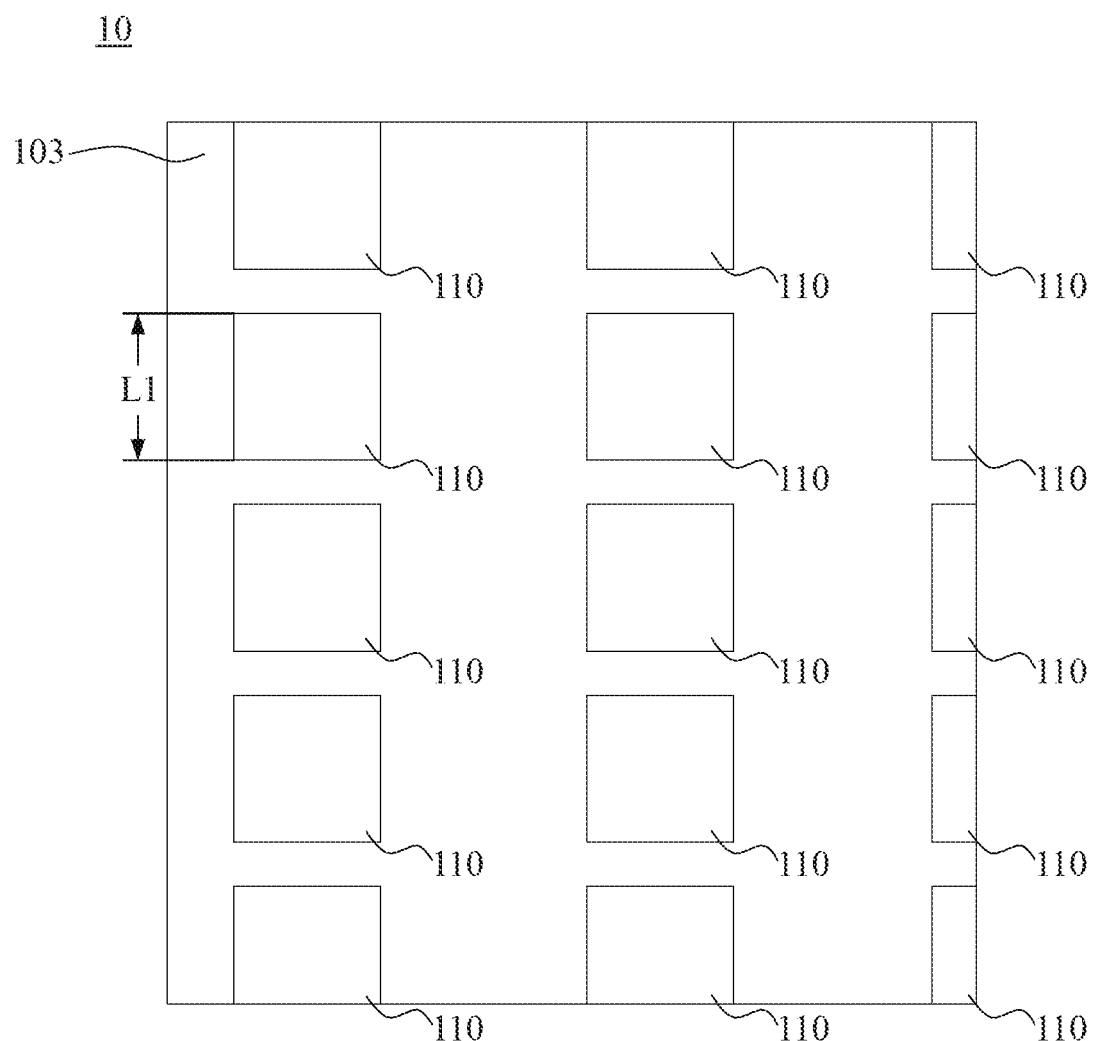
FIGS. 3 and 5 are schematic plan view of the semiconductor device according to FIGS. 2 and 4, respectively.

Referring to FIG. 2, the method of the embodiment provides a semiconductor substrate 10. The semiconductor substrate 10 includes first connecting pads 110.

For example, the semiconductor substrate 10 of the embodiment includes substrate 100, transistors 101, 102, and the first connecting pads 110. The transistors 101, 102 of the embodiment may be vertical transistors. For example, the transistor 101 may include digital line 114, first doped area 115, word line 112 located at an insulating layer 113, and a second doped area 111, and channel region of the transistor 101 extends along direction d1. The first connecting pads 110 is connected to the second doped area 111, and the top surface 103 exposes at least a surface of each of the first connecting pads 110.

The substrate 100 may include silicon (Si) substrate, a germanium (Ge) substrate, or a silicon-germanium (SiGe) substrate, but the disclosure is not limited thereto.

Referring to FIG. 3, at the top surface 103 of the semiconductor substrate 10, the first connecting pads 110 of the embodiment may have square shape, and length L1 of side of the first connecting pads 110 is from 30 nanometer to 50 nanometer.

Figure 4:
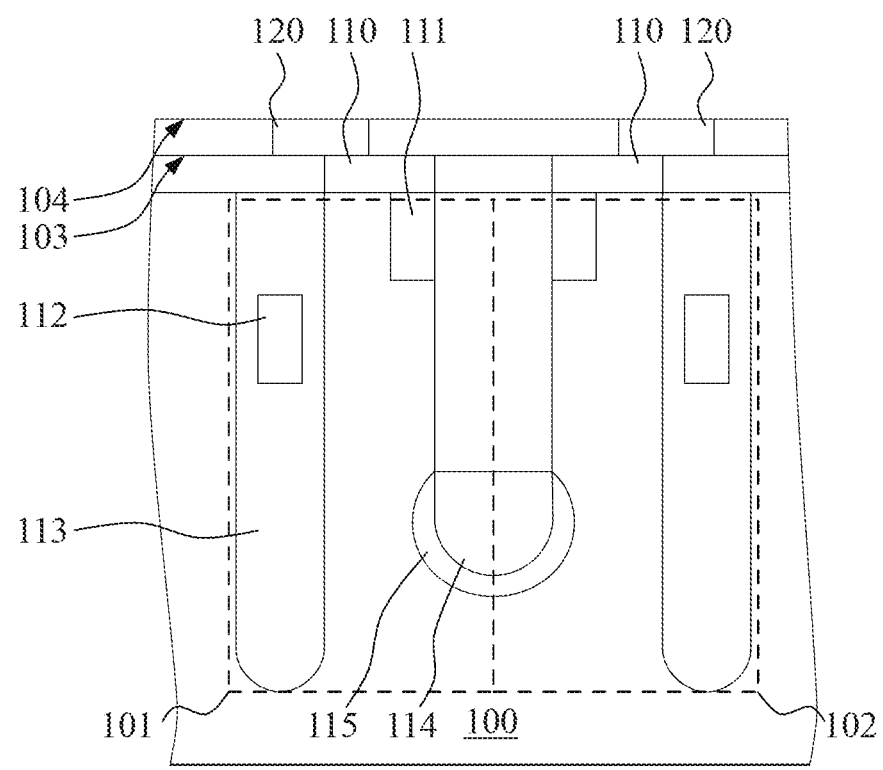
Figure 5:
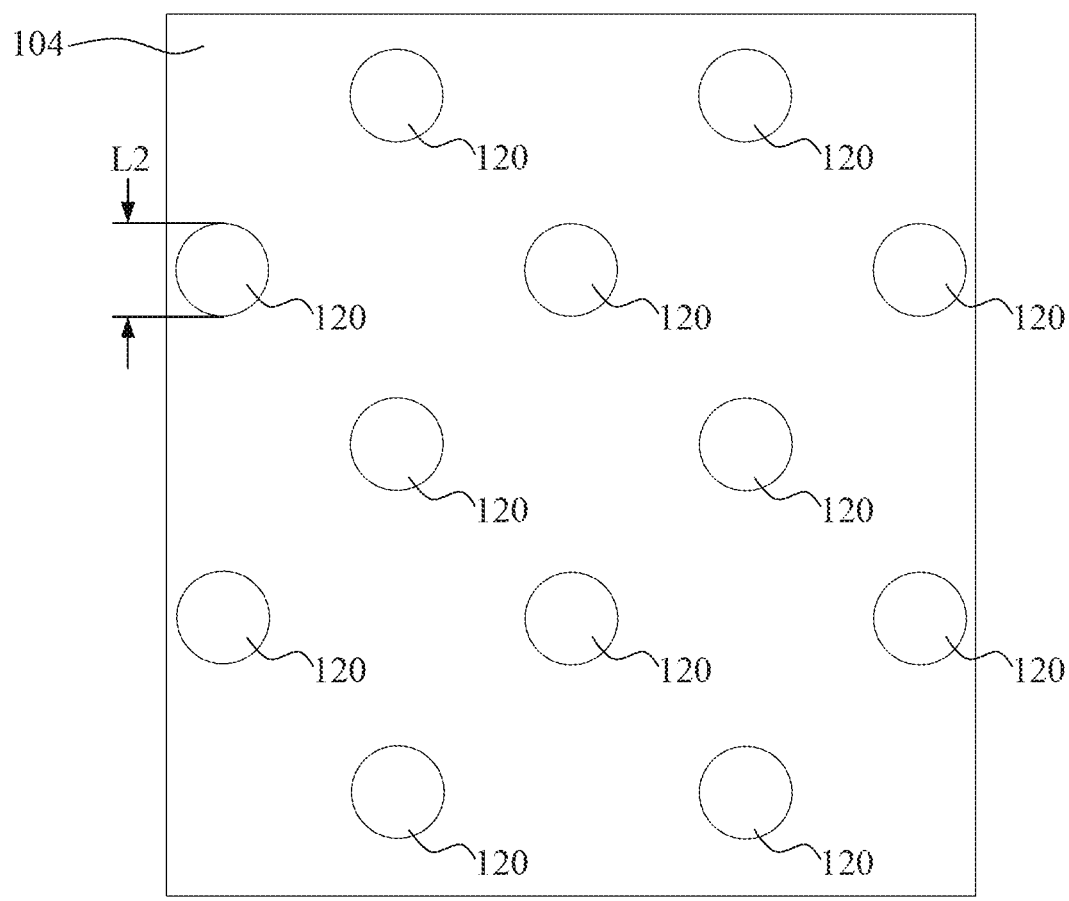

Referring to FIG. 4, the method disposes second connecting pads 120 on the first connecting pads 110. The second connecting pads 120 are disposed on the top surface 103, and arrangement of the second connecting pads 120 on connecting surface 104 is different from arrangement of the first connecting pads 110 on the top surface 103.

Referring to FIG. 5, at the connecting surface 104 of the semiconductor substrate 10, the second connecting pads 120 of the embodiment may have round shape, and diameter L2 of the second connecting pads 120 are from 20 nanometer to 30 nanometer. In other word, size of each of the second connecting pads 120 is smaller than size of each of the first connecting pads 110.

On the other hand, the second connecting pads 120 form a plurality of array on the connecting surface 104, and second connecting pads 120 from adjacent arrays are arranged in alternative manner. In other words, the second connecting pads 120 located on the connecting surface 104 are arranged in a hexagonal lattice manner. Therefore, distribution density of the second connecting pads 120 on the connecting surface 104 can further be improved.

For example, the first connecting pads 110 and the second connecting pads 120 may be formed of any one of the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), tungsten silicon nitride (WSiN), or a combination thereof. A first connecting layer and a second connecting layer may be formed using a chemical vapor deposition or an atomic layer deposition method. After forming the first connecting layer and the second connecting layer, an etching process may be performed, and the first connecting pads 110 and the second connecting pads 120 are obtained.

Figure 6:
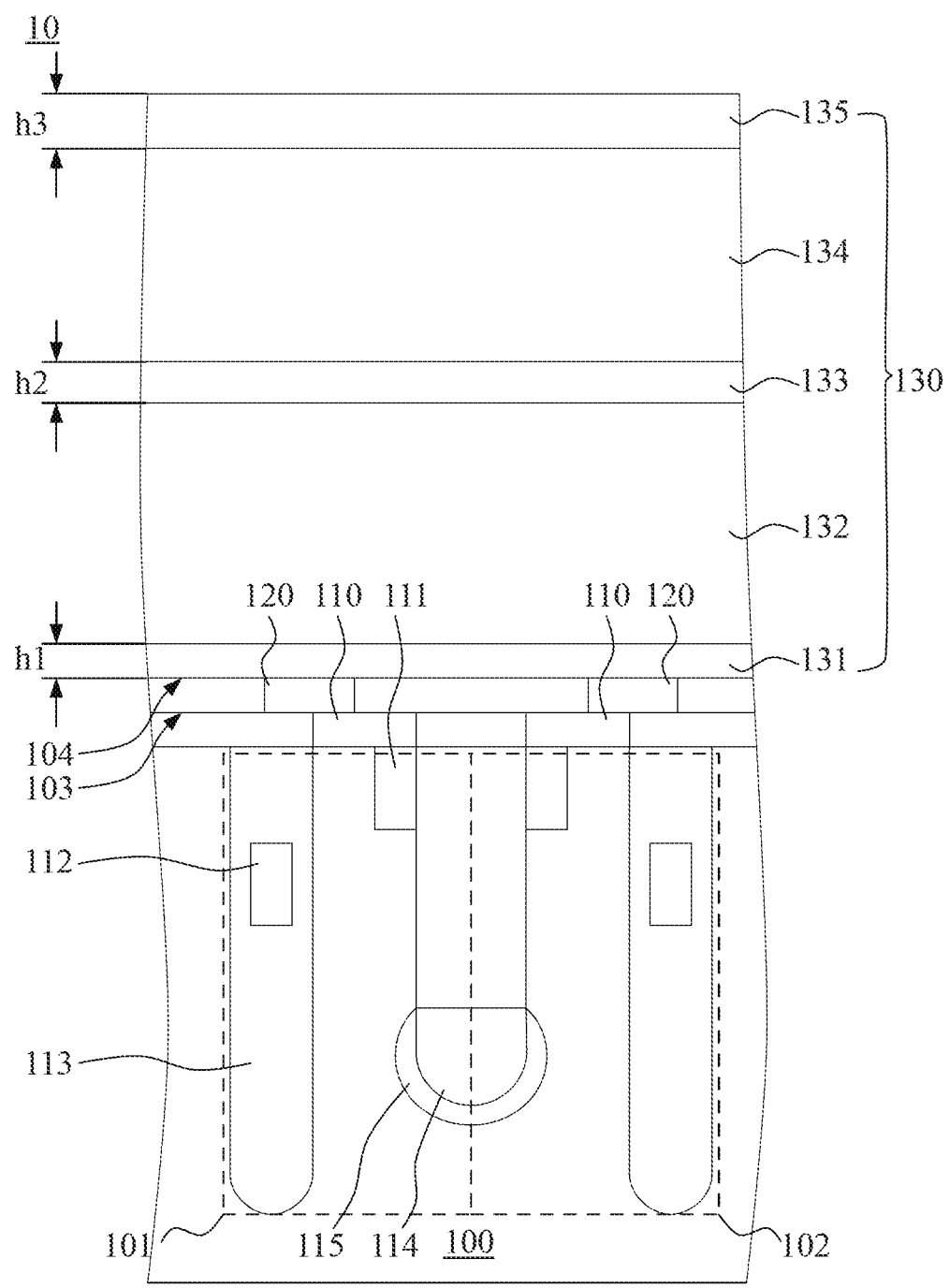

Referring to FIG. 6, the method of the embodiment forms a plurality of insulating layers 130 on the second connecting pads 120 on the semiconductor substrate 10. The insulating layers 130 are disposed on the connecting surface 104, and the second connecting pads 120 are covered with the insulating layers 130.

For example, the insulating layers 130 includes a first nitride layer 131, a first insulating filling layer 132, a second nitride layer 133, a second insulating filling layer 134, and a third nitride layer 135. The first nitride layer 131, the second nitride layer 133 and the third nitride layer 135 provide structural support in the insulating layer 130. Moreover, the first nitride layer 131 has a first thickness h1, and the second nitride layer 133 has a second thickness h2, and the third nitride layer 135 has a third thickness h3, and the third thickness h3 is larger than the first thickness h1, and the first thickness h1 is larger than the second thickness h2. And, therefore, the first nitride layer 131, the second nitride layer 133, and the third nitride layer 135 provide proper structural support.

Figure 7:
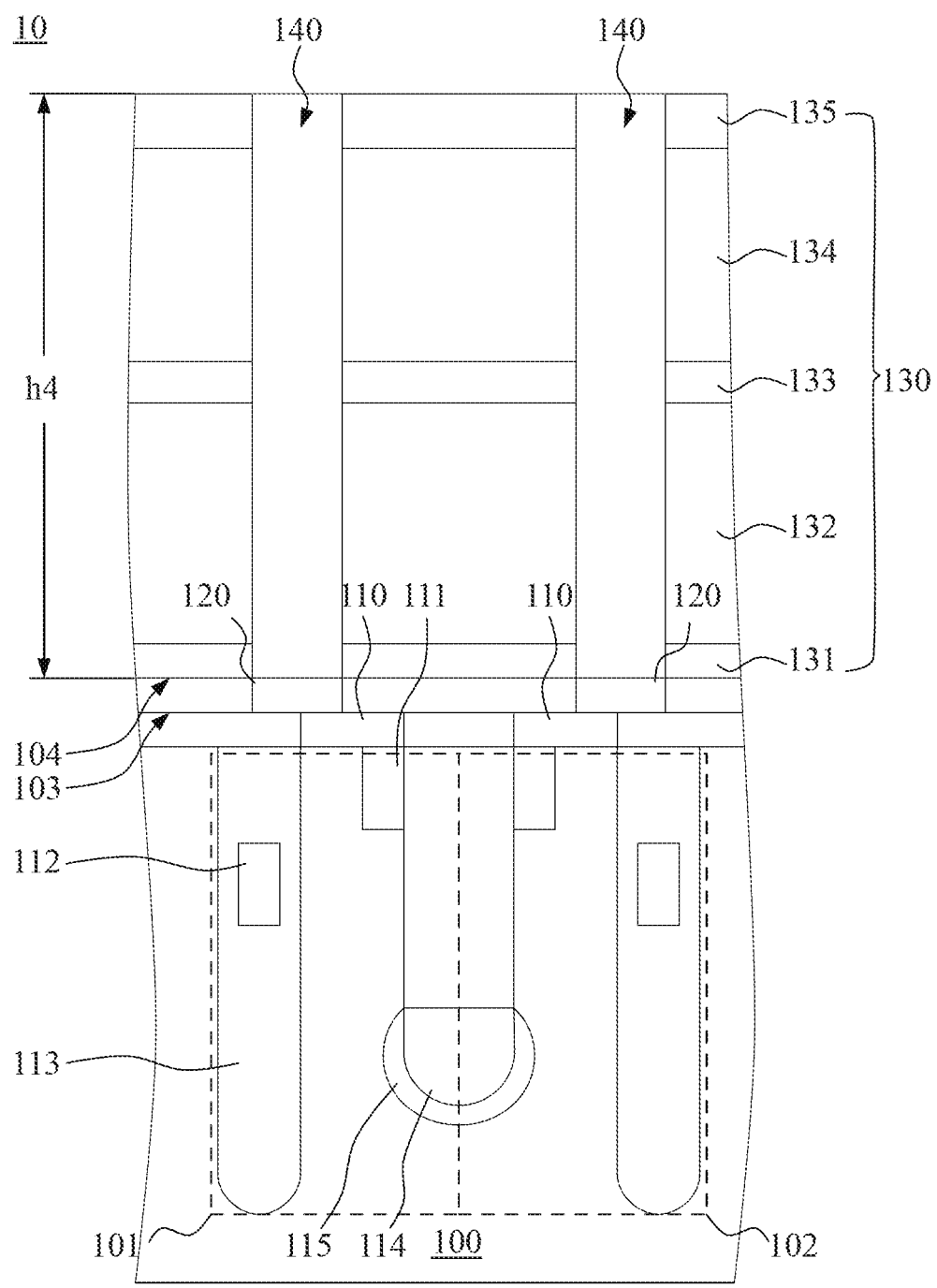

Referring to FIG. 7, the method of the embodiment etches the insulating layers 130 with power of 1000 W and forms a plurality of vertical holes 140. The vertical holes 140 are corresponded to the second connecting pads 120 respectively.

For example, the etching process of the embodiment etching the insulating layers 130 with air flow from 1 to 3 standard cubic centimeter per minutes (SCCM), which allows vertical holes 140 to be etched to a depth h4. The depths h4 of the vertical holes 140 are from 1 micrometer to 1.8 micrometer.

Furthermore, an electrical voltage is added along the normal direction of the connecting surface 104, with the high power etching and the low air flow, the vertical holes 140 and the second connecting pads 120 can be aligned automatically.

Figure 8:
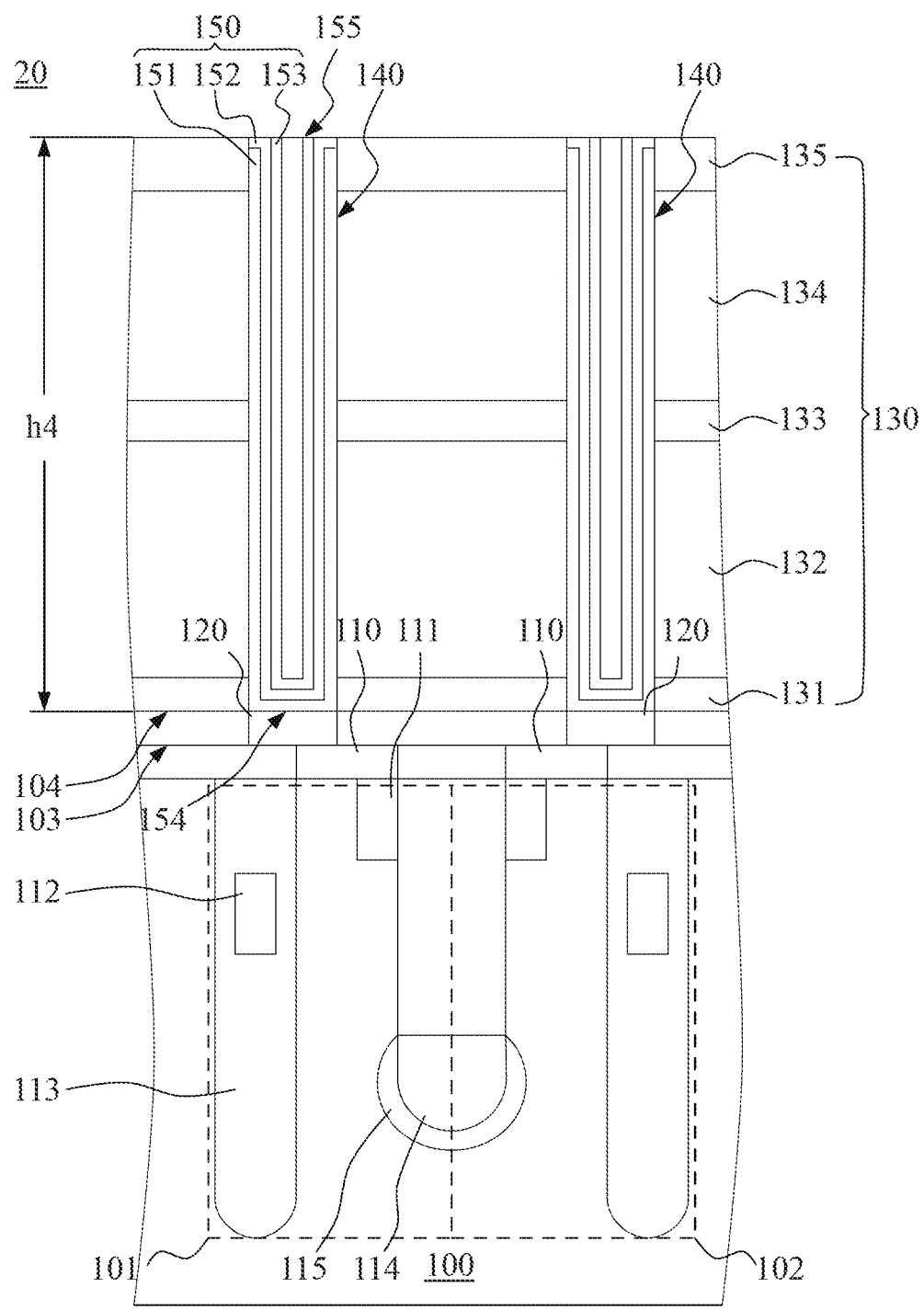

Referring to FIG. 8, a pillar type capacitor 150 is formed in each of the vertical holes 140. The pillar type capacitors 150 are formed in the vertical holes 140 with depth h4, and, therefore, lengths of the pillar type capacitors 150 are the same.

For example, the pillar type capacitor 150 has a first conductive layer 151, an insulating layer 152, and a second conductive layer 153, and the insulating layer 152 is located between the first conductive layer 151 and the second conductive layer 153, and the insulating layer 152 insulates the first conductive layer 151 from the second conductive layer 153.

In other words, each of the pillar type capacitors 150 has a first end 154 connected to the second connecting pad 120 and a second end 155 which is at the opposite side of the first end 154. In this embodiment, the distance between the first end 154 and the second end 155 of every pillar type capacitors 150 is same as the depth h4 of the vertical hole 140, and the distance between the first end 154 and the second end 155 is in the range from 1 micrometer to 1.8 micrometer.

The distribution of the pillar type capacitors 150 in this embodiment are defined by the location of the second connecting pads 120 on the connecting surface 104. The second connecting pads 120 are arranged in a hexagonal lattice manner, and, therefore, the pillar type capacitors 150 of the embodiment can have high distribution density.

In other words, each of the pillar type capacitors 150 is aligned with one of the second connecting pads 120, and the first connecting pad 110 electrically connected to the pillar type capacitor 150 through the second connecting pad 120 is misalign with the pillar type capacitor 150. Therefore, the distribution of the pillar type capacitors 150 on the transistors 101, 102 can be rearranged.

The etching process of the method of the embodiment is etching the insulating layers 130 with power of 1000 W, and the depth h4 of the vertical hole 140 accommodating the pillar type capacitors 150 may in the range from 1 micrometer to 1.8 micrometer. Therefore, the pillar type capacitors 150 in the semiconductor device 20 can provide proper capacitance.

For example, the semiconductor device 20 of the embodiment can be a dynamic random access memory, and the pillar type capacitors 150 and the transistors 101, 102 can form memory cell with proper performance, respectively.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A semiconductor device, comprising:
a semiconductor substrate comprising:
a plurality of first connecting pads; and
a plurality of second connecting pads disposed on the first connecting pads respectively;

a plurality of pillar type capacitors disposed on the second connecting pads respectively; and a plurality of insulating layers disposed on the second connecting pads and disposed between the pillar type capacitors, wherein the insulating layers comprise a first nitride layer, a first insulating filling layer, a second nitride layer, a second insulating filling layer, and a third nitride layer, wherein a first end of each of the pillar type capacitors is connected to one of the second connecting pads, and a second end of each of the pillar type capacitors is at opposite side of the first end, and a distance between the first end and the second end of each of the pillar type capacitors is from 1 micrometer to 1.8 micrometer.

2. The semiconductor device of claim 1, wherein shape of each of the first connecting pads has square shape, and each of the second connecting pads has round shape.

3. The semiconductor device of claim 1, wherein each of the pillar type capacitors is aligned with one of the second connecting pads.

4. The semiconductor device of claim 1, wherein each of the pillar type capacitors is misaligned with one of the first connecting pads which electrically connected to the pillar type capacitors.

5. The semiconductor device of claim 1, wherein the semiconductor substrate has a connecting surface, and the second connecting pads are located at the connecting surface, and the second connecting pads are arranged in a hexagonal lattice manner.

6. The semiconductor device of claim 1, wherein each of the first connecting pads has a square shape, and sides of the square shape are from 30 nanometer to 50 nanometer.

7. The semiconductor device of claim 1, wherein each of the second connecting pads has a round shape, and diameter of the round shape is from 20 nanometer to 25 nanometer.

8. The semiconductor device of claim 1, wherein the semiconductor substrate further includes a plurality of vertical transistors connected to the first connecting pads respectively.

* * * * *